United States Patent
Hsu et al.

(10) Patent No.: US 8,411,017 B2
(45) Date of Patent: Apr. 2, 2013

(54) SHIFT REGISTER AND A LIQUID CRYSTAL DISPLAY DEVICE HAVING THE SAME

(75) Inventors: Je-Hao Hsu, Hsin-Chu (TW); Wen-Pin Chen, Hsin-Chu (TW); Chiu-Mei Yu, Hsin-Chu (TW); Lee-Hsun Chang, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 760 days.

(21) Appl. No.: 12/620,594

(22) Filed: Nov. 18, 2009

(65) Prior Publication Data

US 2010/0309191 A1 Dec. 9, 2010

(30) Foreign Application Priority Data

Jun. 4, 2009 (TW) .............................. 98118552 A (51) Int. Cl.
*G09G 3/36* (2006.01)
*G09G 3/38* (2006.01)

(52) U.S. Cl. ....................................... 345/100; 345/213

(58) Field of Classification Search .................. None
See application file for complete search history.

(56) References Cited

U.S. PATENT DOCUMENTS

| 6,970,530 B1 * | 11/2005 | Wang et al. ..................... 377/69 |
| 7,317,780 B2 | 1/2008 | Lin |
| 2006/0291610 A1 * | 12/2006 | Lo et al. .......................... 377/64 |
| 2007/0086558 A1 | 4/2007 | Wei |
| 2007/0171115 A1 | 7/2007 | Kim |
| 2008/0219401 A1 * | 9/2008 | Tobita ............................. 377/79 |

FOREIGN PATENT DOCUMENTS

| CN | 101000417 A | 7/2007 |
| CN | 100389452 C | 5/2008 |

* cited by examiner

*Primary Examiner* — Christopher R Lamb
(74) *Attorney, Agent, or Firm* — Winston Hsu; Scott Margo (57) ABSTRACT

A shift register of an LCD device operates based on two clock signals and maintains the gate voltage of an output transistor switch using two pull-down transistor switches. The gate voltages of the pull-down transistor switches are switched periodically between the high and low level of the clock signals. During the output period, the transistor switches have negative gate-source voltages so as to reduce leakage.

21 Claims, 7 Drawing Sheets

SHIFT REGISTER AND A LIQUID CRYSTAL DISPLAY DEVICE HAVING THE SAME

BACKGROUND OF THE INVENTION

1. Field of the Invention

The present invention is related to a shift register of an LCD device, and more particularly, to a shift register of an LCD device which reduces leakage.

2. Description of the Prior Art

Liquid crystal display (LCD) devices, characterized in low radiation, thin appearance and low power consumption, have gradually replaced traditional cathode ray tube (CRT) displays and been widely used in electronic products, such as personal digital assistants (PDAs), flat-panel televisions or mobile phones. Traditional LCD devices display images by driving the pixels of the panel using external chips. Recently, the GOA technique, in which the driving circuits are directly fabricated on the LCD panel, has been developed in order to reduce the number of devices and to lower manufacturing costs.

Figure 1:
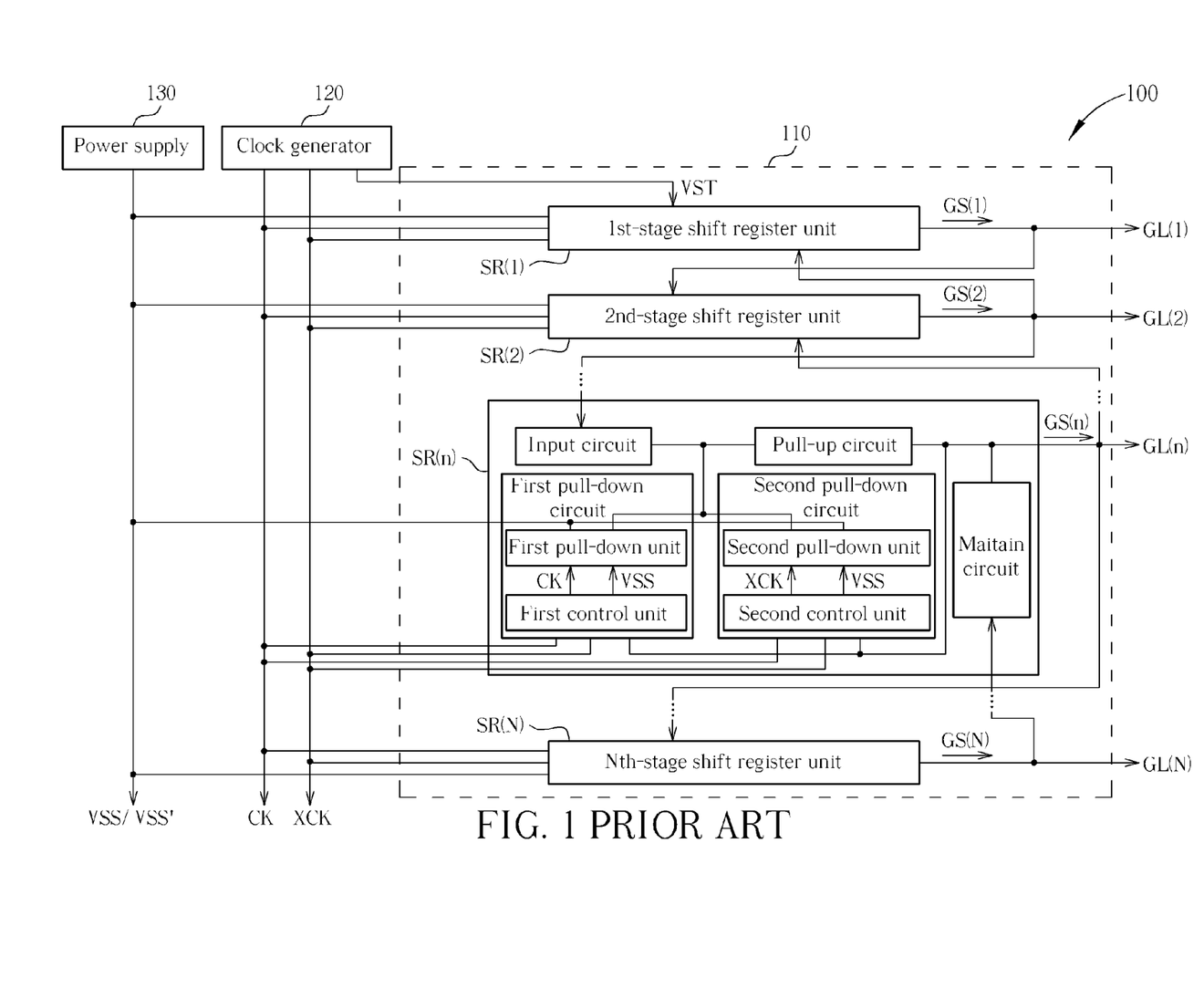
FIG. 1 is a simplified block diagram of a prior art LCD device.

Reference is made to FIG. 1 for a simplified block diagram of a prior art LCD device 100. FIG. 1 only illustrates partial structure of the LCD 100, including a plurality of gate lines GL(1)-GL(N), a shift register 110, a clock generator 120, and a power supply 130. For operating the shift register 110, the clock generator 120 provides a start pulse signal VST and two clock signals CK and XCK, while the power supply 130 provides a bias voltage VSS or VSS'. The clock signals CK and XCK periodically switch between a high voltage level and a low voltage level, and have opposite phases at the same time. The high and low voltage levels of the clock signals CK and XCK are represented by VGH and VGL, wherein VGL is lower than the level of the bias voltage VSS.

The shift register 110 includes a plurality of shift register units SR(1)-SR(N) each having output ends coupled to the corresponding gate lines GL(1)-GL(N), respectively. According to the clock signals CK, XCK and the start pulse signal VST, the shift register 110 can sequentially output gate driving signals GS(1)-GS(N) to the corresponding gate lines GL(1)-GL(N) using the shift register units SR(1)-SR(N), respectively. In the prior art LCD device 100, each shift register unit includes a first pull-down circuit, a second pull-down circuit, an input circuit, a pull-up circuit, and a maintain circuit. The first pull-down circuit includes a first pull-down unit and a first control circuit, while the second pull-down circuit includes a second pull-down unit and a second control circuit.

Figure 2:
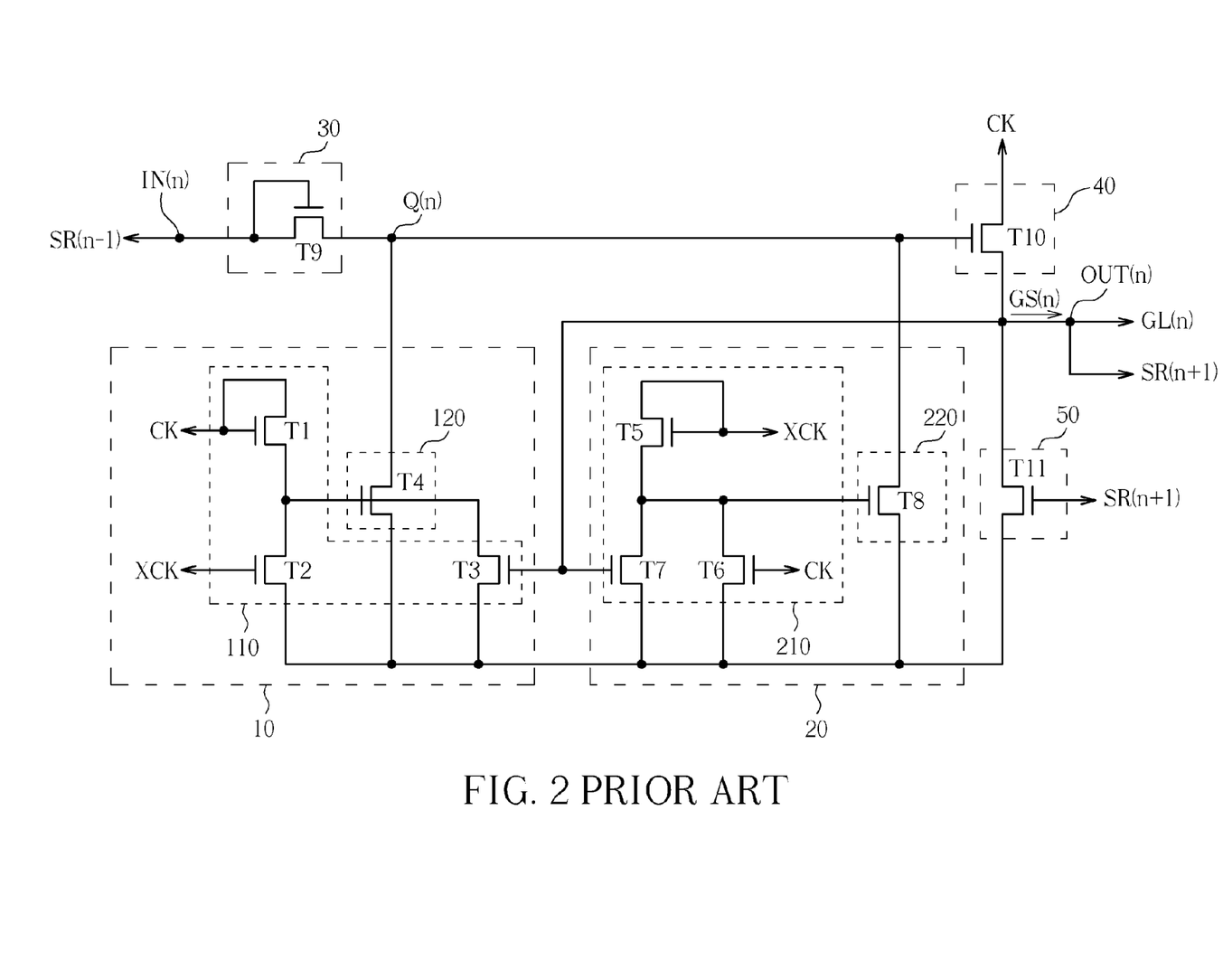
FIG. 2 is a diagram of a prior art nth-stage shift register unit.

Reference is made to FIG. 2 for a diagram illustrating an nth-stage shift register unit SR(n) among the plurality of shift register units SR(1)-SR(N), wherein n is an integer between 1 and N. The shift register unit SR(n) includes an input end IN(n), an output end OUT(n), a first pull-down circuit 10, a second pull-down circuit 20, an input circuit 30, a pull-up circuit 40, and a maintain circuit 50. The input end IN(n) of the shift register unit SR(n) is coupled to a prior-stage shift register unit SR(n−1), while the output end OUT(n) of the shift register unit SR(n) is coupled to a next-stage shift register unit SR(n+1) and the gate line GL(n).

The input circuit 30 includes a transistor switch T9, the pull-up circuit 40 includes a transistor switch T10, and the maintain circuit 50 includes a transistor switch T11. The transistor switches T9-T11 can receive the gate driving signal GS(n−1) transmitted from the (n−1)th-stage shift register unit SR(n−1), thereby generating the nth-stage gate driving signal GS(n) accordingly.

In the first pull-down circuit 10, the first control circuit 110 includes transistor switches T1-T3, while the first pull-down unit 120 includes a transistor switch T4. The transistor switches T1-T3 can maintain the gate voltage of the transistor switch T4 according to the clock signals CK, XCK and the gate driving signal GS(n), while the transistor switch T4 can maintain the voltage level of the node Q(n) according to its gate voltage. Since the transistor switches T1 and T2 coupled in series receive the clock signals CK and XCK having opposite phases at respective gate terminals, and the transistor switch T3 receives the gate driving signal GS(n) at its gate terminal, the gate terminal of the transistor switch T4 can be kept at the high voltage level VGH or the low voltage level VSS according to the voltage levels of the clock signals CK, XCK and the gate driving signal GS(n). With the drain terminal coupled to the node Q(n) and the source terminal coupled to the power supply 130 for receiving the low level bias voltage VSS, the transistor switch T4 can control the signal transmission path between the node Q(n) and the low level bias voltage VSS according to its gate voltage.

In the second pull-down circuit 20, the second control circuit 210 includes transistor switches T5-T7, while the second pull-down unit 220 includes a transistor switch T8. The transistor switches T5-T7 can maintain the gate voltage of the transistor switch T8 according to the clock signals CK, XCK and the gate driving signal GS(n), while the transistor switch T8 can maintain the voltage level of the node Q(n) according to its gate voltage. Since the transistor switches T5 and T6 coupled in series receive the clock signals CK and XCK having opposite phases at respective gate terminals, and the transistor switch T7 receives the gate driving signal GS(n) at its gate terminal, the gate terminal of the transistor switch T8 can be kept at the high voltage level VGH or the low voltage level VGL according to the voltage levels of the clock signals CK, XCK and the gate driving signal GS(n). With the drain terminal coupled to the node Q(n) and the source terminal coupled to the power supply 430 for receiving the low level bias voltage VSS, the transistor switch T8 can control the signal transmission path between the node Q(n) and the low level bias voltage VSS according to its gate voltage.

Except during the nth-stage output period, the node Q(n) needs to be kept at low level for turning off the transistor switch T10. With the first pull-down circuit 11 and the second pull-down circuit 21 each in charge of 50% of the pull-down operation, the gate driving signal GS(n) can thus be maintained at low level. The pull-down operation is performed by the first pull-down circuit 11 when the clock signal CK is at high level. The transistor switch T1 is turned on and the transistor switch T2 is turned off, thereby pulling up the gate terminal of the transistor switch T4 to the high voltage level VGH of the clock signal CK via the turned-on transistor switch T1. Therefore, the transistor switch T4 can be turned on for pulling down the node Q(n) to the low voltage level VSS. On the other hand, the pull-down operation is performed by the second pull-down circuit 21 when the clock signal XCK is at high level. The transistor switch T5 is turned on and the transistor switch T6 is turned off, thereby pulling up the gate terminal of the transistor switch T8 to the high voltage level VGH of the clock signal XCK via the turned-on transistor switch T5. Therefore, the transistor switch T8 can be turned on for pulling down the node Q(n) to the low voltage level VSS. On the other hand, when the first pull-down circuit 11 is not performing the pull-down operation, the gate terminal of the transistor switch T4 is kept at the low voltage level VGL of the clock signal XCK during the time other than the nth-stage output period, while the gate terminal of the transistor switch T8 is kept at the low voltage level VGL of the clock signal CK during the time other than the nth-stage output period.

During the nth-stage output period, the node Q(n) needs to be kept at high level so that the transistor switch T10 can be turned on for outputting high level gate driving signal GS(n). In order to stop the first pull-down circuit 11 and the second pull-down circuit 21 from performing the pull-down operation, the transistor switches T4 and T8 need to be turned off. In other words, the gate terminals of the transistor switches T4 and T8 are kept at the low voltage level VSS using the transistor switches T3 and T7 when the gate driving signal GS(n) is at high level. However, it takes time for the gate terminals of the transistor switches T4 and T8 to be pulled down to VSS from VGH. During this transient period, the transistor switch T2 may not be completely turned on due to possible leakage at the node Q(n). As a result, the gate driving signal GS(n) may not be able to reach ideal voltage level.

Figure 3:
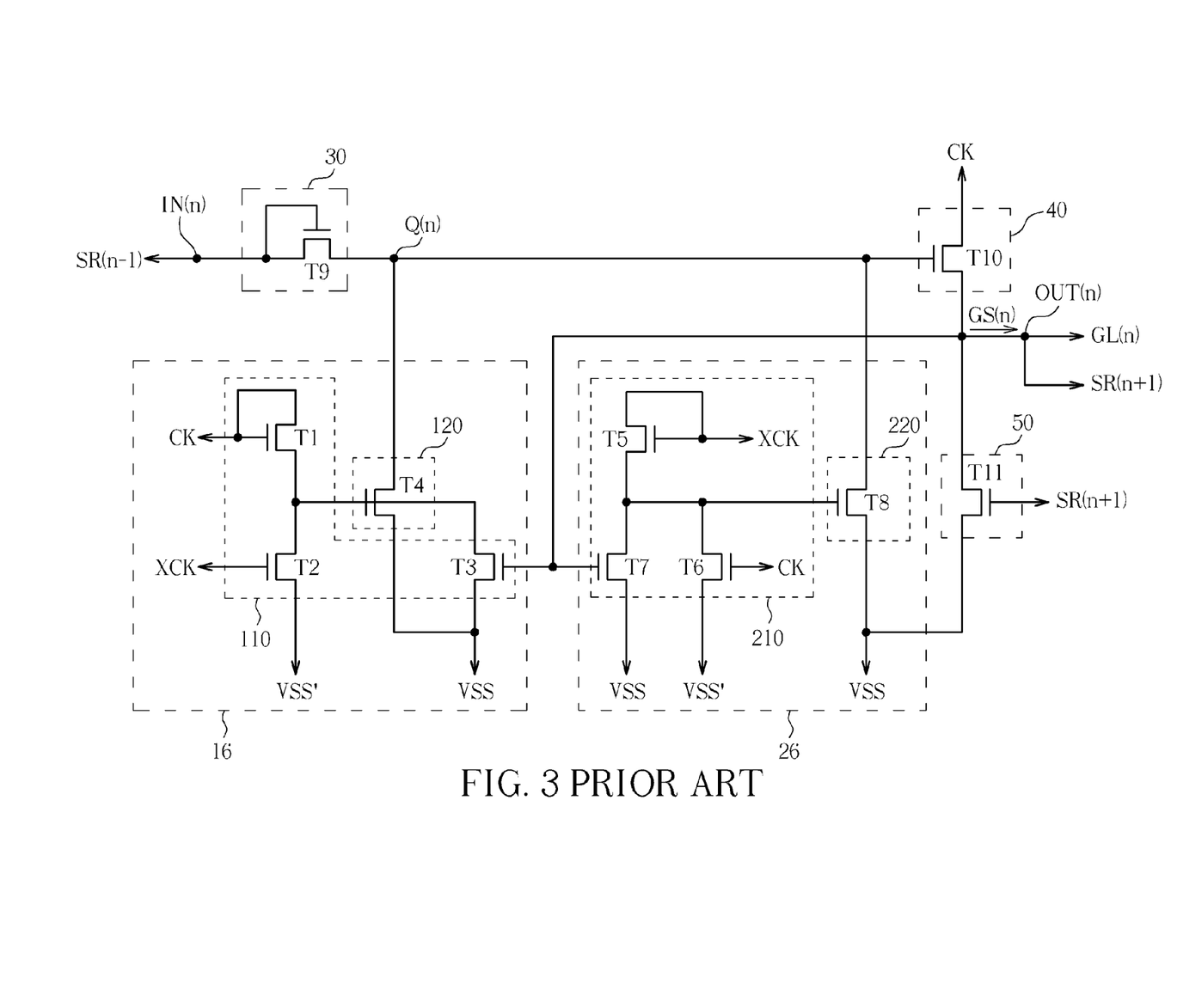
FIG. 3 is a diagram of another prior art nth-stage shift register unit.

Reference is made to FIG. 3 for a diagram illustrating another prior art nth-stage shift register unit SR(n) among the plurality of shift register units SR(1)-SR(N), wherein n is an integer between 1 and N. The shift register unit SR(n) includes an input end IN(n), an output end OUT(n), a first pull-down circuit 16, a second pull-down circuit 26, an input circuit 30, a pull-up circuit 40, and a maintain circuit 50. In the shift register unit SR(n) depicted in FIGS. 2 and 3, the input circuit 30, the pull-up circuit 40 and the maintain circuit 50 have similar structure and operation. The first pull-down circuit 16 also includes a first control circuit 110 and a first pull-down unit 120, wherein the transistor switches T1-T4 have similar structure as depicted in FIG. 2. However, a low level bias voltage VSS is applied to the source terminals of the transistor switches T3 and T4, while a low level bias voltage VSS' is applied to the source terminal of the transistor switch T2. On the other hand, the second pull-down circuit 26 also includes a second control circuit 210 and a second pull-down unit 220, wherein the transistor switches T5-T8 have similar structure as depicted in FIG. 2. However, the low level bias voltage VSS is applied to the source terminals of the transistor switches T7 and T8, while the low level bias voltage VSS' is applied to the source terminal of the transistor switch T6. The bias voltage VSS and VSS' have different voltage levels.

Except during the nth-stage output period, the low level bias voltage VSS' can accelerate the pull-down operation performed by the transistor switches T2 and T6. However, during the nth-stage output period, it still takes time for the gate terminals of the transistor switches T4 and T8 to be pulled down to VSS from VGH. During this transient period, the transistor switch T2 may not be completely turned on due to possible leakage at the node Q(n). As a result, the gate driving signal GS(n) may not be able to reach ideal voltage level.

SUMMARY OF THE INVENTION

These and other objectives of the present invention will no doubt become obvious to those of ordinary skill in the art after reading the following detailed description of the preferred embodiment that is illustrated in the various figures and drawings.

DETAILED DESCRIPTION

Figure 4:
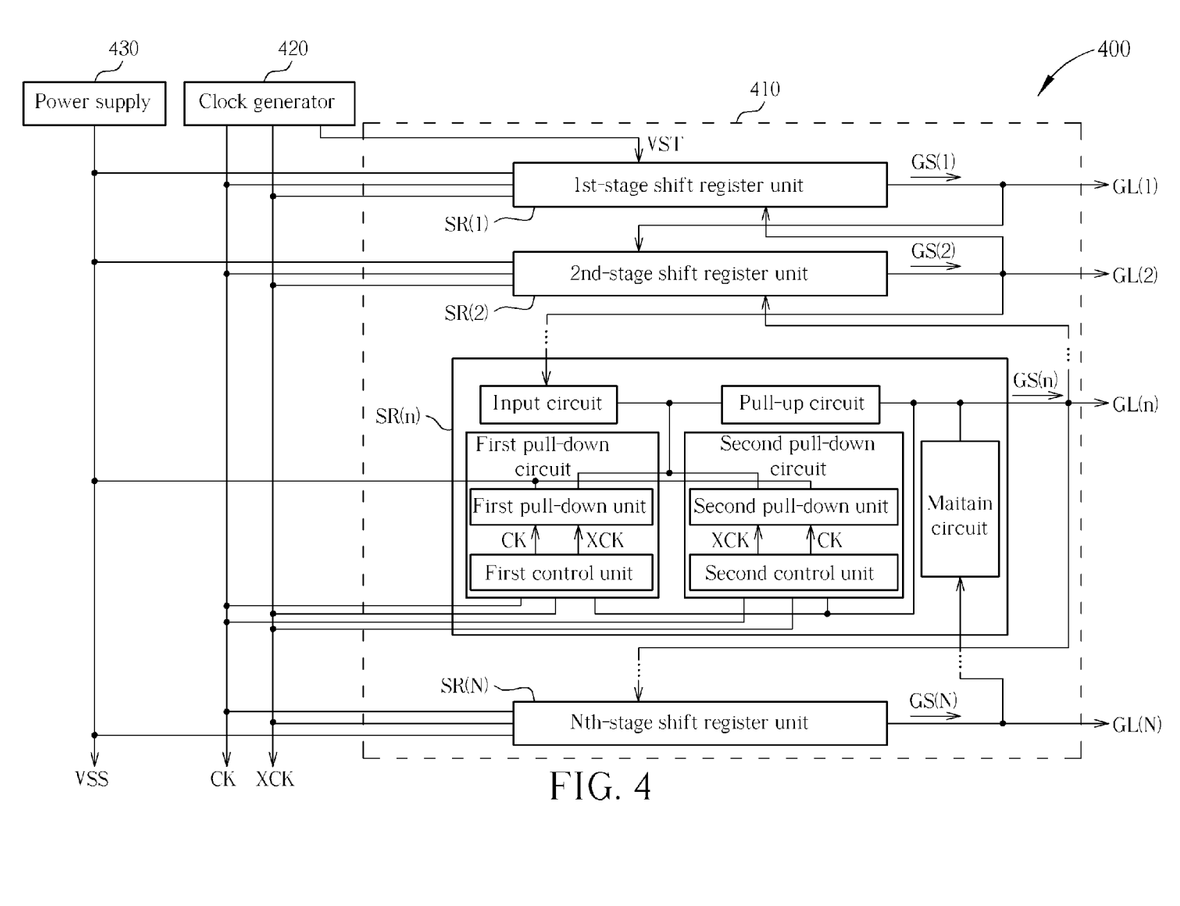
FIG. 4 is a simplified block diagram of an LCD device according to the present invention.

Reference is made to FIG. 4 for a simplified block diagram of an LCD device 400 according to the present invention. FIG. 4 only illustrates partial structure of the LCD 400, including a plurality of gate lines GL(1)-GL(N), a shift register 410, a clock generator 420, and a power supply 430. For operating the shift register 410, the clock generator 420 provides a start pulse signal VST and two clock signals CK and XCK, while the power supply 430 provides a bias voltage VSS. The clock signals CK and XCK periodically switch between a high voltage level and a low voltage level, and have opposite phases at the same time. The high and low voltage levels of the clock signals CK and XCK are represented by VGH and VGL, wherein VGL is lower than VSS.

The shift register 410 includes N shift register units SR(1)-SR(N) each having output ends respectively coupled to the corresponding gate lines GL (1)-GL(N), wherein N is a positive integer greater than or equal to 3. According to the clock signals CK, XCK and the start pulse signal VST, the shift register 410 can sequentially output gate driving signals GS(1)-GS(N) to the corresponding gate lines GL(1)-GL(N) using the shift register units SR(1)-SR(N), respectively. In the LCD device 400 of the present invention, each shift register unit includes a first pull-down circuit, a second pull-down circuit, an input circuit, a pull-up circuit, and a maintain circuit. The first pull-down circuit includes a first pull-down unit and a first control circuit, while the second pull-down circuit includes a second pull-down unit and a second control circuit. Both the first and the second control circuits operate according to the clock signals CK and XCK.

Figure 5:
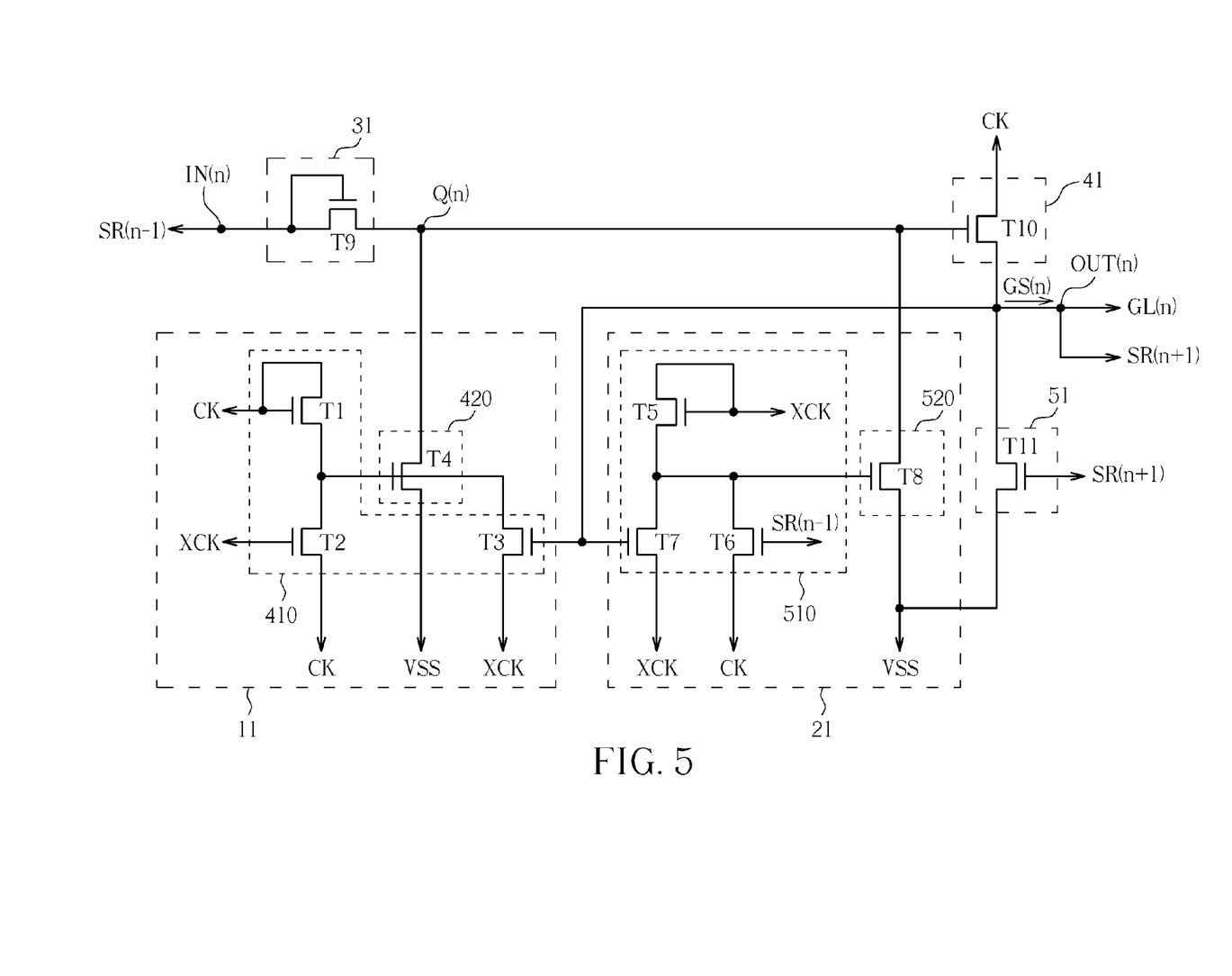
FIG. 5 is a diagram of an nth-stage shift register unit according to the first embodiment of the present invention.

Reference is made to FIG. 5 for a diagram illustrating an nth-stage shift register unit SR(n) among the plurality of shift register units SR(1)-SR(N) according to the first embodiment of the present invention (n is an integer between 1 and N). The shift register unit SR(n) includes an input end IN(n), an output end OUT(n), a first pull-down circuit 11, a second pull-down circuit 21, an input circuit 31, a pull-up circuit 41, and a maintain circuit 51. The input end IN(n) of the shift register unit SR(n) is coupled to a prior-stage shift register unit SR(n−1), while the output end OUT(n) of the shift register unit SR(n) is coupled to a next-stage shift register unit SR(n+1) and the gate line GL(n).

The input circuit 31 includes a transistor switch T9 having a gate terminal and a drain terminal both coupled to the input end IN(n) of the shift register unit SR(n) and a source terminal coupled to the node Q(n). The pull-up circuit 41 includes a transistor switch T10 having a gate terminal coupled to the node Q(n), a drain terminal coupled to the clock generator 420 for receiving the clock signal CK), and a source terminal coupled to the output end OUT(n). The maintain circuit 51 includes a transistor switch T11 having a gate terminal coupled to the shift register unit SR(n+1), a drain terminal coupled to the output end OUT(n) of the shift register unit SR(n), and a source terminal coupled to the power supply 430 for receiving the low level bias voltage VSS. Therefore, the input circuit 31 can control the signal transmission path between the input end IN(n) and the node Q(n) according to the gate driving signal GS(n−1), the pull-up circuit 41 can control the signal transmission path between the clock signal CK and the output end OUT(n) according to the voltage level of the node Q(n), and the maintain circuit 51 can control the signal transmission path between the output end OUT(n) and the low level bias voltage VSS according to the gate driving signal GS(n+1).

In the first pull-down circuit 11, the first control circuit 410 includes transistor switches T1, T2 and T3, while the first pull-down unit 420 includes a transistor switch T4. The transistor switches T1-T3 can maintain the gate voltage of the transistor switch T4 according to the clock signals CK and XCK, while the transistor switch T4 can maintain the voltage level of the node Q(n) according to its gate voltage. The transistors T1 and T2 coupled in series receive the clock signals CK and XCK having opposite phases at respective gate terminals, the transistor switch T3 receives the gate driving signal GS(n) at its gate terminal, the transistor switch T2 receives the clock signal CK at its source terminal, and the transistor switch T3 receives the clock signal XCK at its source terminal. Therefore, the transistor switches T1-T3 of the first pull-down circuit 410 can keep the gate terminal of the transistor switch T4 at the high voltage level VGH or the low voltage level VGL according to the voltage levels of the clock signals CK, XCK and the gate driving signal GS(n). On the other hand, with the drain terminal coupled to the node Q(n) and the source terminal coupled to the power supply 430 for receiving the low level bias voltage VSS, the transistor switch T4 can control the signal transmission path between the node Q(n) and the low level bias voltage VSS according to its gate voltage.

In the second pull-down circuit 21, the second control circuit 420 includes transistor switches T5, T6 and T7, while the second pull-down unit 520 includes a transistor switch T8. The transistor switches T5-T7 can maintain the gate voltage of the transistor switch T8 according to the clock signal XCK, the gate driving signal GS(n−1) and the gate driving signal GS(n), while the transistor switch T8 can maintain the voltage level of the node Q(n) according to its gate voltage. The transistor switch T5 receives the clock signal XCK at its gate terminal, the transistor switch T6 receives the gate driving signal GS(n−1) at its gate terminal, the transistor switch T7 receives the gate driving signal GS(n) at its gate terminal, the transistor switch T6 receives the clock signal CK at its source terminal, and the transistor switch T7 receives the clock signal XCK at its source terminal. Therefore, the transistor switches T5-T7 of the second control circuit 520 can maintain the gate terminal of the transistor switch T8 at the high voltage level VGH or the low voltage level VSS according to the voltage levels of the clock signals CK, XCK, the gate driving signal GS(n−1) and the gate driving signal GS(n). On the other hand, with the drain terminal coupled to the node Q(n) and the source terminal coupled to the power supply 430 for receiving the low level voltage VSS, the transistor switch T8 can control the signal transmission path between the node Q(n) and the low level voltage VSS according to its gate voltage.

During the time excluding the nth-stage output period, the node Q(n) needs to be kept at low level for turning off the transistor switch T10. With the first pull-down circuit 10 and the second pull-down circuit 20 each in charge of 50% of the pull-down operation, the gate driving signal GS(n) can thus be maintained at low level. The pull-down operation is performed by the first pull-down circuit 11 when the clock signal CK is at high level. The transistor switch T1 is turned on and the transistor switch T2 is turned off, thereby pulling up the gate terminal of the transistor switch T4 to the high voltage level VGH of the clock signal CK via the turned-on transistor switch T1. Therefore, the transistor switch T4 can be turned on for pulling down the node Q(n) to the low voltage level VGL. The pull-down operation is performed by the second pull-down circuit 21 when the clock signal XCK is at high level. The transistor switch T5 is turned on and the transistor switch T6 is turned off, thereby pulling up the gate terminal of the transistor switch T8 to the high voltage level VGH of the clock signal XCK via the turned-on transistor switch T5. Therefore, the transistor switch T8 can be turned on for pulling down the node Q(n) to the low voltage level VSS. On the other hand, when the first pull-down circuit 11 is not performing the pull-down operation, the gate terminal of the transistor switch T4 is maintained at the low voltage level VGL of the clock signal XCK during the time excluding the nth-stage output period; when the second pull-down circuit 21 is not performing the pull-down operation, the gate terminal of the transistor switch T8 is maintained at the low voltage level VGL of the clock signal CK during the time excluding the nth-stage output period.

During the nth-stage output period, the node Q(n) needs to be kept at high level so that the transistor switch T10 can be turned on for outputting the high level gate driving signal GS(n). In order to stop the first pull-down circuit 11 and the second pull-down circuit 21 from performing the pull-down operation, the transistor switches T4 and T8 need to be turned off. In other words, the gate terminals of the transistor switches T4 and T8 are kept at the low voltage level VGL of the clock signal XCK using the transistor switches T3 and T7 when the gate driving signal GS(n) is at high level. Since the low voltage level VGL of the clock signals CK and XCK is lower than the bias voltage VSS, the gate voltages (VGL) of the transistor switches T4 and T8 are lower than their respective source voltages (VSS). Therefore, the transistor switch T2 can be completely turned on to prevent leakage in the transistor switches T4 and T8 which may pull down the voltage level of the node Q(n).

Figure 6:
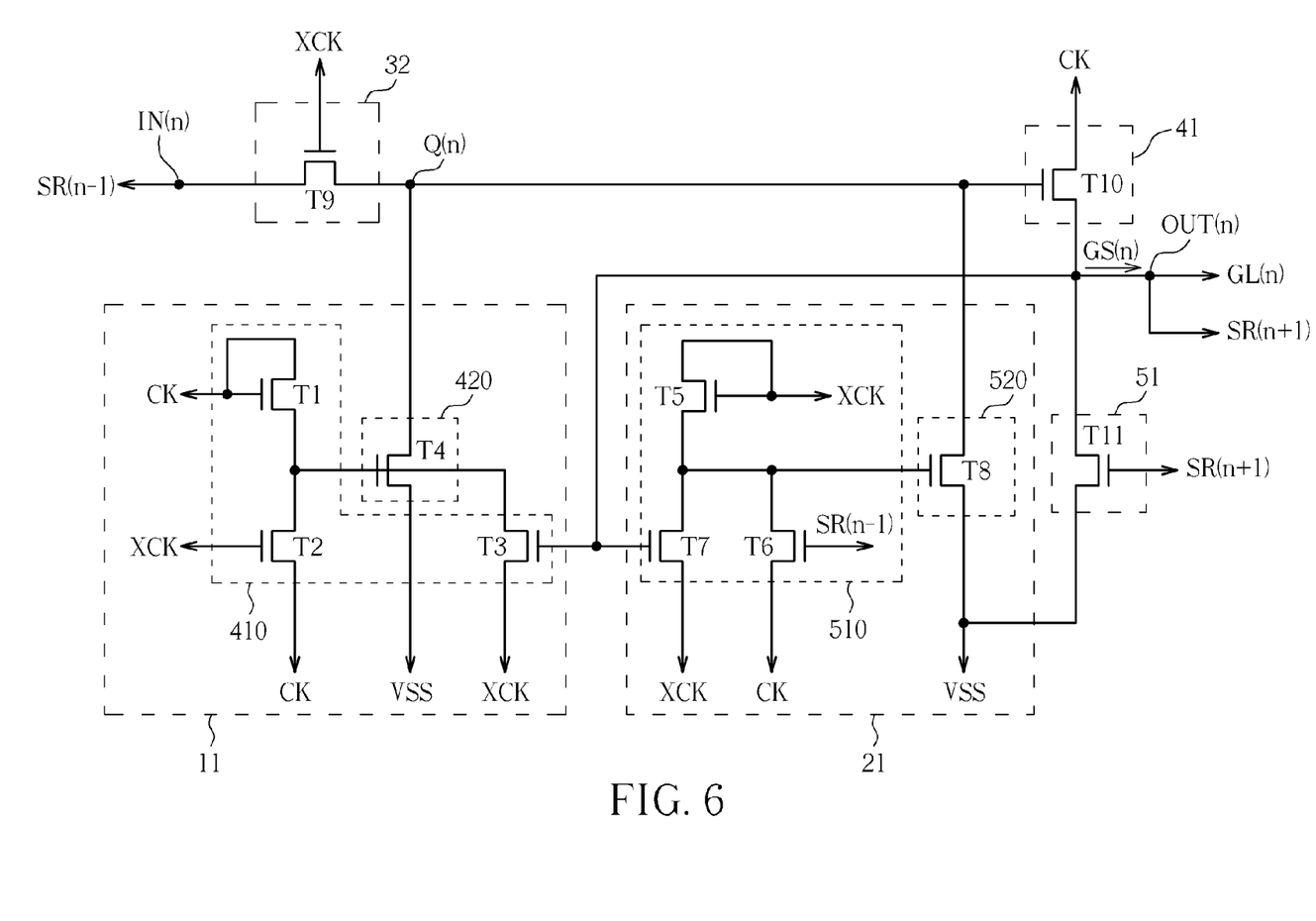
FIG. 6 is a diagram of an nth-stage shift register unit according to the second embodiment of the present invention.

Reference is made to FIG. 6 for a diagram illustrating an nth-stage shift register unit SR(n) among the plurality of shift register units SR(1)-SR(N) according to the second embodiment of the present invention (n is an integer between 1 and N). Similar to the first embodiment, the shift register unit SR(n) of the second embodiment also includes an input end IN(n), an output end OUT(n), a first pull-down circuit 11, a second pull-down circuit 21, a pull-up circuit 41, and a maintain circuit 51. However, the first and second embodiments differ in the structure of the input circuit. The input circuit 32 according to the second embodiment of the present invention includes a transistor switch T9 having a gate terminal coupled to the clock generator 420 for receiving the clock signal XCK, a drain terminal coupled to the input end IN(n) of the shift register unit SR(n), and a source terminal coupled to the node Q(n), thereby capable of controlling the signal transmission path between the input end IN(n) and the node Q(N) according to the clock signal XCK. During the nth-stage output period, the gate terminals of the transistor switches T4 and T8 can also be maintained using the transistor switches T3 and T7 in the second embodiment of the present invention. By keeping the gate voltages (VGL) lower than their respective source voltages (VSS) to prevent leakage in the transistor switches T4 and T8, the transistor switch T2 can be completely turned on for outputting the high level gate driving signal GS(n).

Figure 7:
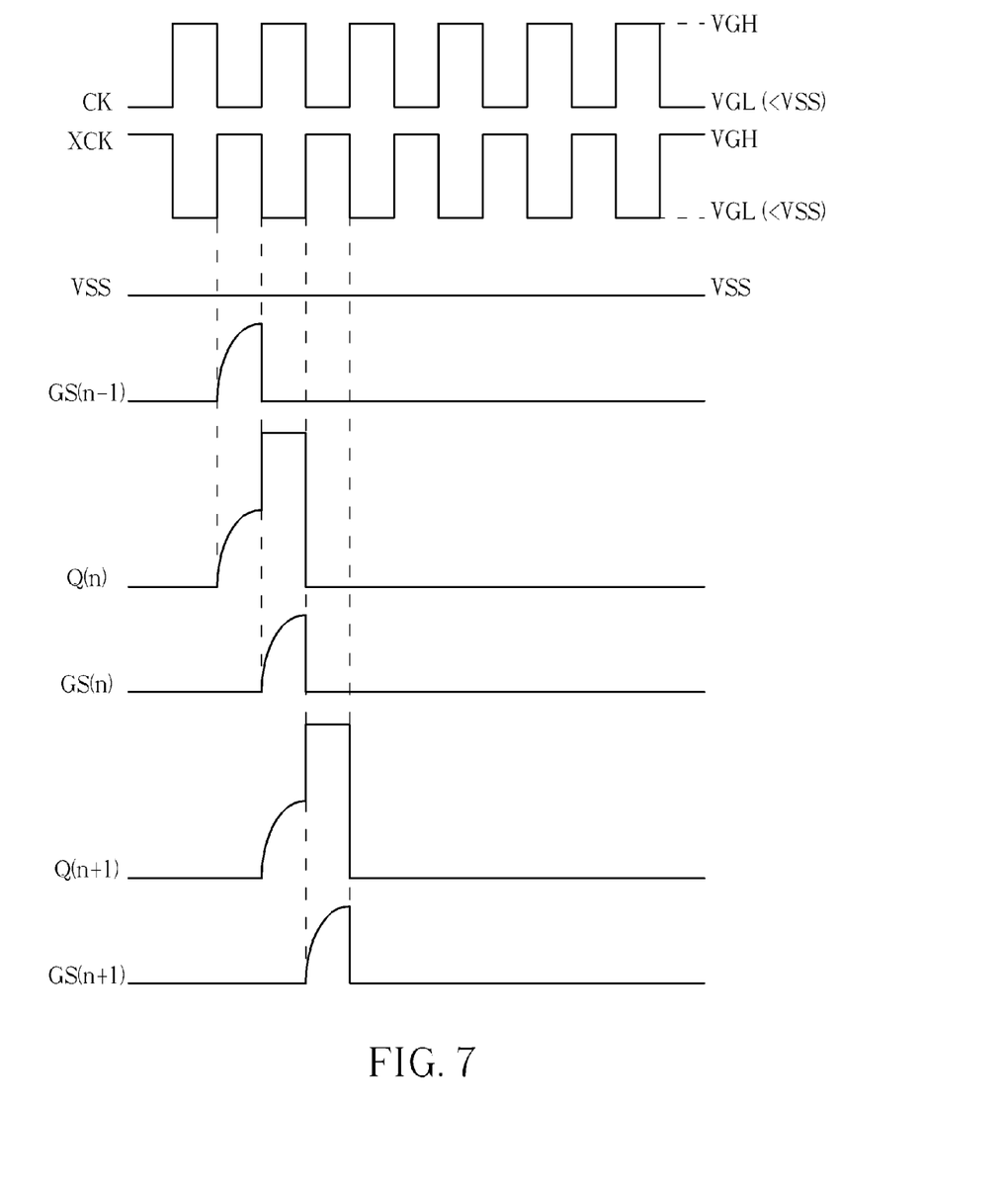
FIG. 7 is a timing diagram illustrating the operation of the LCD device according to the present invention.

Reference is made to FIG. 7 for a timing diagram illustrating the operation of the LCD device 400 according to the present invention. FIG. 7 depicts the waveforms of the clock signal CK, the clock signal XCK, the bias voltage VSS, the node Q(n) and Q(n+1), and the gate driving signals GS(n−1), GS(n) and GS(n+1). The bias voltage is kept at a constant low level, such as −6V. The clock signals CK and XCK are pulse signals which periodically switch between a high voltage level VGH and a low voltage level VGL, wherein VGL (such as −9.75V) is lower than VSS. In the shift register unit SR(n) according to the present invention, when the first pull-down circuit 11 and the second pull-down circuit 12 stop performing the pull-down operation, the low voltage level VGL of the clock signals CK and XCK can turn off the transistor switches T4 and T8 more quickly, as well as keep the gate-to-source voltage (Vgs) of the transistor switches T4 and T8 at a negative value in order to prevent leakage. The present invention maintains voltages using the existing clock signals CK and XCK instead of using extra power supplies.

Those skilled in the art will readily observe that numerous modifications and alterations of the device and method may be made while retaining the teachings of the invention.

What is claimed is:

1. A shift register comprising a plurality of shift register units coupled in series, each shift register unit comprising:
    an input end for receiving an input voltage;
    an output end for outputting an output voltage;
    a node;
    an input circuit for transmitting the input voltage to the node;
    a pull-up circuit for providing the output voltage according to a first clock signal and a voltage level of the node, wherein the first clock signal periodically switches between a high voltage level and a low voltage level;
    a first pull-down circuit for maintaining the voltage level of the node according to the first clock signal and a second clock signal, wherein the second clock signal periodically switches between the high voltage level and the low voltage level, and the first and second clock signals have opposite phases in a same period, the first pull-down circuit comprising:
        a first pull-down unit for controlling a signal transmission path between a first bias voltage and the node according to a first control signal, wherein a voltage level of the first bias voltage is higher than the low voltage level of the first and second clock signals; and
        a first control unit for providing the first control signal by outputting the first clock signal or the second clock signal according to the voltage levels of the first clock signal, the second clock signal, and the output voltage, the first control unit comprising:
            a first switch including:
                a first end for receiving the first clock signal;
                a second end for outputting the first control signal; and
                a control end coupled to the first end of the first switch;
            a second switch including:
                a first end coupled to the second end of the first switch;
                a second end for receiving the first clock signal; and
                a control end for receiving the second clock signal; and
            a third switch including:
                a first end coupled to the second end of the first switch;
                a second end for receiving the second clock signal; and
                a control end for receiving the output signal; and
    a second pull-down circuit for maintaining the voltage level of the node according to the second clock signal and a signal transmitted from a prior-stage shift register unit, the second pull-down circuit comprising:
        a second pull-down unit for controlling a signal transmission path between a second bias voltage and the node according to a second control signal, wherein a voltage level of the second bias voltage is higher than the low voltage level of the first and second clock signals; and
        a second control unit for providing the second control signal by outputting the first clock signal or the second clock signal according to the voltage levels of the first clock signal, the signal transmitted from the prior-stage shift register unit, and the output voltage.

2. The shift register of claim 1 wherein the first pull-down unit comprises:
    a fourth switch including:
        a first end coupled to the node;
        a second end for receiving the first bias voltage; and
        a control end for receiving the first control signal.

3. The shift register of claim 1 wherein the second control unit comprises:
    a fifth switch including:
        a first end for receiving the second clock signal;
        a second end for outputting the second control signal; and
        a control end coupled to the first end of the fifth switch;
    a sixth switch including:
        a first end coupled to the second end of the fifth switch;
        a second end for receiving the first clock signal; and
        a control end for receiving the signal transmitted from the prior-stage shift register unit; and
    a seventh switch including:
        a first end coupled to the second end of the fifth switch;
        a second end for receiving the second clock signal; and
        a control end for receiving the output signal.

4. The shift register of claim 3 wherein the second pull-down unit comprises:
    an eighth switch including:
        a first end coupled to the node;
        a second end for receiving the second bias voltage; and
        a control end for receiving the second control signal.

5. The shift register of claim 1 wherein the input circuit comprises:
    a ninth switch including:
        a first end coupled to the input end of the shift register unit;
        a second end coupled to the node; and
        a control end coupled to the first end of the ninth switch.

6. The shift register of claim 1 wherein the input circuit comprises:
    a ninth switch including:
        a first end coupled to the input end of the shift register unit;
        a second end coupled to the node; and
        a control end for receiving the second clock signal.

7. The shift register of claim 1 wherein the pull-up circuit comprises:
    a tenth switch including:
        a first end for receiving the first clock signal;
        a second end coupled to the output end of the shift register unit; and
        a control end coupled to the node.

8. The shift register of claim 1 further comprising:
    an eleventh switch including:

a first end coupled to the output end of the shift register unit;
a second end for receiving the second bias voltage; and
a control end coupled to a next-stage shift register unit.

9. The shift register of claim 1 wherein the input end of the shift register unit is coupled to an output end of a prior-stage shift register unit for receiving the input signal.

10. The shift register of claim 1 wherein the first to eighth switches include thin film transistors (TFTs).

11. The shift register of claim 1 wherein the first and the second bias voltages have identical voltage level.

12. A liquid crystal display device which reduces leakage comprising:
a pixel array;
a clock generator for providing a first clock signal and a second clock signal, wherein the first and second clock signals periodically switch between a high voltage level and a low voltage level, and have opposite phases in a same period;
a power supply for providing a bias voltage, wherein a voltage level of the bias voltage is higher than the low voltage level of the first and second clock signals; and
a shift register for driving the pixel array and including a plurality of shift register units coupled in series, each shift register unit comprising:
an input end for receiving an input voltage;
an output end for outputting an output voltage;
a node;
an input circuit for transmitting the input voltage to the node;
a pull-up circuit for providing the output voltage according to the first clock signal and a voltage level of the node;
a first pull-down circuit for maintaining the voltage level of the node according to the first and the second clock signals, the first pull-down circuit comprising:
a first pull-down unit for controlling a signal transmission path between the bias voltage and the node according to a first control signal; and
a first control unit for providing the first control signal by outputting the first clock signal or the second clock signal according to the voltage levels of the first clock signal, the second clock signal and the output voltage, the first control unit comprising:
a first switch including:
a first end for receiving the first clock signal;
a second end for outputting the first control signal; and
a control end coupled to the first end of the first switch;
a second switch including:
a first end coupled to the second end of the first switch;
a second end for receiving the first clock signal; and
a control end for receiving the second clock signal; and
a third switch including:
a first end coupled to the second end of the first switch;
a second end for receiving the second clock signal; and
a control end for receiving the output signal; and
a second pull-down circuit for maintaining the voltage level of the node according to the second clock signal and a signal transmitted from a prior-stage shift register unit, the second pull-down circuit comprising:
a second pull-down unit for controlling a signal transmission path between the bias voltage and the node according to a second control signal; and
a second control unit for providing the second control signal by outputting the first clock signal or the second clock signal according to the voltage levels of the first clock signal, the signal transmitted from the prior-stage shift register unit, and the output voltage.

13. The shift register of claim 12 wherein the first pull-down unit comprises:
a fourth switch including:
a first end coupled to the node;
a second end for receiving the bias voltage; and
a control end for receiving the first control signal.

14. The shift register of claim 12 wherein the second control unit comprises:
a fifth switch including:
a first end for receiving the second clock signal;
a second end for outputting the second control signal; and
a control end coupled to the first end of the fifth switch;
a sixth switch including:
a first end coupled to the second end of the fifth switch;
a second end for receiving the first clock signal; and
a control end for receiving the signal transmitted from the prior-stage shift register unit; and
a seventh switch including:
a first end coupled to the second end of the fifth switch;
a second end for receiving the second clock signal; and
a control end for receiving the output signal.

15. The shift register of claim 14 wherein the second pull-down unit comprises:
an eighth switch including:
a first end coupled to the node;
a second end for receiving the bias voltage; and
a control end for receiving the second control signal.

16. The shift register of claim 12 wherein the input circuit comprises:
a ninth switch including:
a first end coupled to the input end of the shift register unit;
a second end coupled to the node; and
a control end coupled to the first end of the ninth switch.

17. The shift register of claim 12 wherein the input circuit comprises:
a ninth switch including:
a first end coupled to the input end of the shift register unit;
a second end coupled to the node; and
a control end for receiving the second clock signal.

18. The shift register of claim 12 wherein the pull-up circuit comprises:
a tenth switch including:
a first end for receiving the first clock signal;
a second end coupled to the output end of the shift register unit; and
a control end coupled to the node.

19. The shift register of claim 12 further comprising:
an eleventh switch including:
a first end coupled to the output end of the shift register unit;
a second end for receiving the bias voltage; and
a control end coupled to a next-stage shift register unit.

20. The shift register of claim 12 wherein the input end of the shift register unit is coupled to an output end of a prior-stage shift register unit for receiving the input signal.

21. The shift register of claim 12 wherein the first to eighth switches include TFTs.

* * * * *